United States Patent
Pei et al.

(10) Patent No.: US 10,317,792 B2
(45) Date of Patent: Jun. 11, 2019

(54) MASK PLATE

(71) Applicant: Wuhan China Star Optoelectronics Semiconductor Display Technology Co., Ltd., Wuhan, Hubei (CN)

(72) Inventors: Long Pei, Guangdong (CN); Chunlai Song, Guangdong (CN)

(73) Assignee: Wuhan China Star Optoelectronics Semiconductor Display Technology Co., Ltd., Wuhan, Hubei (CN)

( * ) Notice: Subject to any disclaimer, the term of this patent is extended or adjusted under 35 U.S.C. 154(b) by 10 days.

(21) Appl. No.: 15/577,314

(22) PCT Filed: Aug. 11, 2017

(86) PCT No.: PCT/CN2017/097225
§ 371 (c)(1),
(2) Date: Nov. 27, 2017

(87) PCT Pub. No.: WO2019/000600
PCT Pub. Date: Jan. 3, 2019

(65) Prior Publication Data
US 2019/0018314 A1    Jan. 17, 2019

(30) Foreign Application Priority Data

Jun. 30, 2017 (CN) .......................... 2017 1 0526094

(51) Int. Cl.
*G03F 1/42* (2012.01)
*G02F 1/13* (2006.01)

(52) U.S. Cl.
CPC . *G03F 1/42* (2013.01); *G02F 1/13* (2013.01)

(58) Field of Classification Search
CPC .................................. G03F 1/42; G02F 1/13
See application file for complete search history.

(56) References Cited

U.S. PATENT DOCUMENTS

| 2010/0192856 A1* | 8/2010 | Sung ..................... C23C 14/042 118/721 |
| 2011/0146573 A1* | 6/2011 | Park ...................... C23C 14/042 118/712 |

(Continued)

FOREIGN PATENT DOCUMENTS

| CN | 102110787 A | 6/2011 |
| CN | 102131949 A | 7/2011 |

(Continued)

*Primary Examiner* — Karen Kusumakar
(74) *Attorney, Agent, or Firm* — Andrew C. Cheng

(57) ABSTRACT

A mask plate includes an outer frame and a plurality of sub-mask plates, the outer frame includes a first side, a second side, a third side and a fourth side. The third side and the fourth side are parallel to each other and extended along a first direction, the first side and the second side are spaced apart from each other parallelly and extended along a second direction. Two opposite ends of the third side are connected to one end of the first side and one end of the second side, and two opposite ends of the fourth side are connected to another end of the first side and another end of the second side. The sub-mask plates selectively shield the luminescent material when preparing pixels, and extend along the first direction and arrange along the second direction and do reciprocating motion along the first direction or the second direction.

10 Claims, 2 Drawing Sheets

(56) References Cited

U.S. PATENT DOCUMENTS

2017/0141313 A1    5/2017  Min
2017/0179390 A1    6/2017  Baek

FOREIGN PATENT DOCUMENTS

| CN | 203034082 U | 7/2013 |
|---|---|---|
| CN | 204401095 U | 6/2015 |
| CN | 104746015 A | 7/2015 |
| CN | 104846329 A | 8/2015 |
| CN | 205590781 U | 9/2016 |
| CN | 206282833 U | 6/2017 |

\* cited by examiner

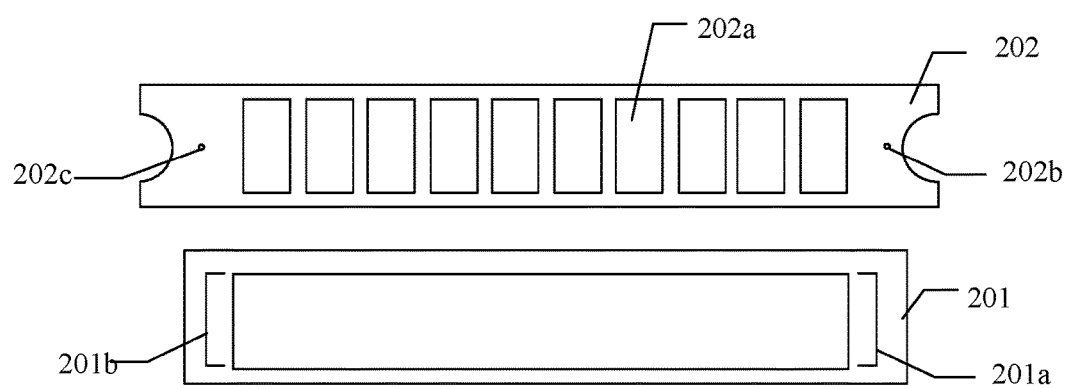
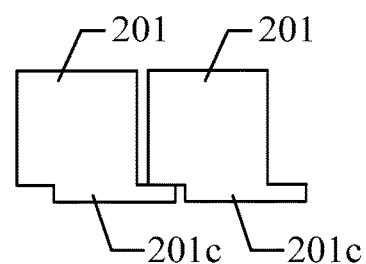
FIG. 2
FIG. 3

MASK PLATE

RELATED APPLICATIONS

The present application claims the benefit of the priority of Chinese Patent Application No. 201710526094.X, entitled "MASK PLATE" and filed on Jun. 30, 2017, the disclosure of which is incorporated by reference herein in its entirety for all purposes.

TECHNICAL FIELD

The present disclosure relates to the field of liquid crystal display, and more particularly to a mask plate.

BACKGROUND

Liquid crystal display, as a kind of common electronic equipment, has been widely used in people's daily life. In practical use, a Organic Light Emitting Display (OLED) is widely used because of its advantages such as low cost of production, self-luminous and no need of backlight, etc. During the preparation of the OLED, a mask plate is used to vapor-deposit luminescent material in the area of light-emitting pixels on a glass substrate. With the development of OLED technology, the size of the OLED display and the size of the glass substrate are constantly increasing, which also requires a continuous increase in the size of the mask plate, in order to ensure the accuracy of making the mask plate, the mask plate used in vapor-deposition is mostly used in the form of strip-shaped sub-mask plates. In general, when the strip-shaped sub-mask plate is welded on a bottom frame, the welding position is likely to occur position deviation, thereby resulting in the poor color mixing of prepared OLEDs, and further resulting in the production of defective products.

SUMMARY

The disclosure provides a mask plate which includes an outer frame and a plurality of sub-mask plates, the outer frame is a hollow structure and includes a first side, a second side, a third side and a fourth side. The first side and the second side are parallel to and spaced apart from each other, and the third side and the fourth side are parallel to and spaced apart from each other. The third side and the fourth side are extended along a first direction, and the first side and the second side are extended along a second direction. The third side has two opposite ends. One end of the third side is connected to one end of the first side and the other end of the third side is connected to one end of the second side. The fourth side has two opposite ends. One end of the fourth side is connected to one end of the first side away from the third side and the other end of the fourth side is connected to one end of the second side away from the third side. Each sub-mask plate is configured to selectively shield the luminescent material when preparing pixels. The sub-mask plate is extended along the first direction and the plurality of sub-mask plates are arranged along the second direction. Two opposite ends of the sub-mask plate are respectively disposed on the first side and the second side. The sub-mask plate can do reciprocating motion along the first direction or the second direction.

Compared with the related art, the sub-mask plate of the mask plate provided by the present disclosure is capable of doing reciprocating motion along the first direction or the second direction, so as to adjust the position of the sub-mask plate relative to the bottom frame in the first direction or the second direction, thereby, the technical issue of the poor color mixing caused by the position deviation of the sub-mask plate relative to the outer frame in the first direction and the second direction is mitigated when the luminescent material is used for preparing the pixel.

BRIEF DESCRIPTION OF THE DRAWINGS

In order to illustrate the technical solutions of the embodiments of the present disclosure more clearly, the drawings used in the description of the embodiments will be briefly described, it will be apparent that the drawings described in the following are embodiments of the present disclosure, and it will be apparent to those skilled in the art that other drawings can be obtained from the drawings without any creative work.

FIG. 2 illustrates a schematic diagram of a sub-mask plate in accordance with an embodiment of the present disclosure.

FIG. 3 illustrates a schematic diagram of a section of two adjacent bottom frames in accordance with an embodiment of the present disclosure.

DETAILED DESCRIPTION OF ILLUSTRATED EMBODIMENTS

Figure 1:
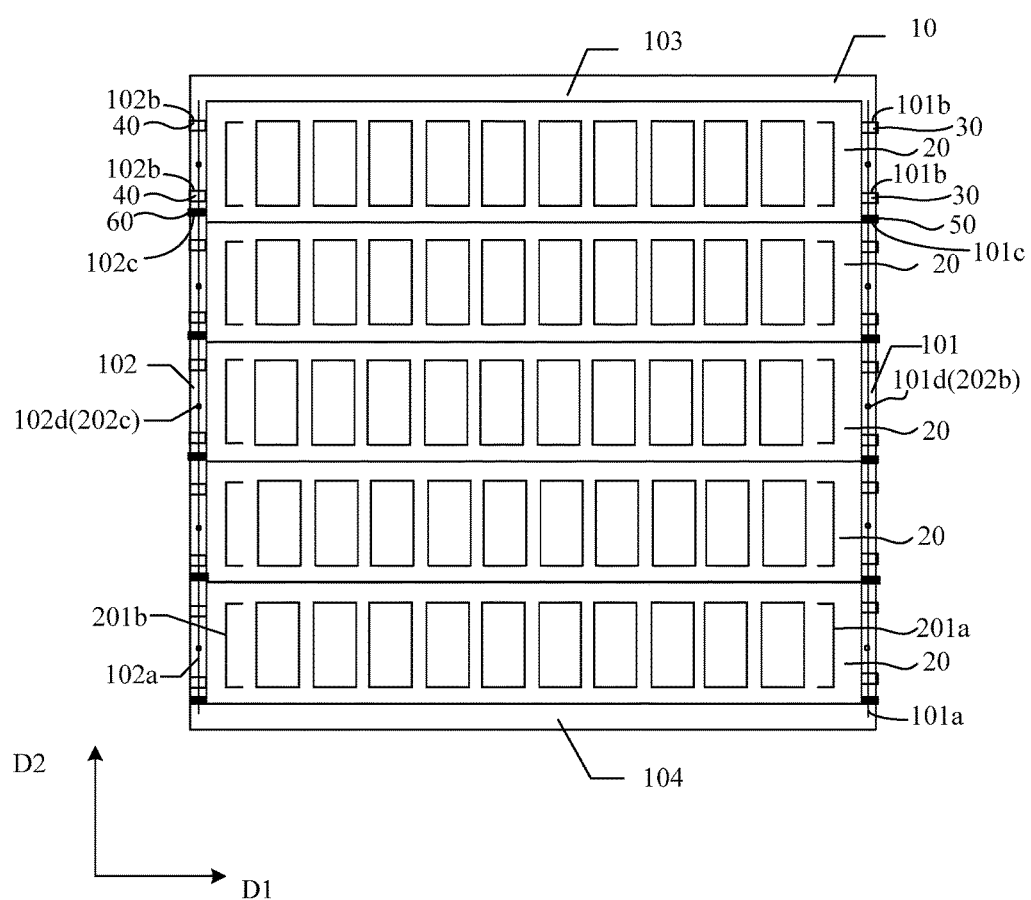
FIG. 1 illustrates a schematic diagram of a mask plate in accordance with an embodiment of the present disclosure.

A clear and complete description of technical solutions provided in the embodiments of the present disclosure will be given below, in conjunction with the accompanying drawings in the embodiments of the present disclosure. Apparently, the embodiments described below are merely a part, but not all, of the embodiments of the present disclosure. All of other embodiments, obtained by those skilled in the art based on the embodiments of the present disclosure without any inventive efforts, shall fall into the protection scope of the present disclosure.

FIG. 1 is a schematic diagram of a mask plate in accordance with an embodiment of the present disclosure. A mask plate 1 includes an outer frame 10 and a plurality of sub-mask plates 20. The outer frame 10 is a hollow structure, and the outer frame 10 includes a first side 101, a second side 102, a third 103 and a fourth side 104. The first side 101 and the second side 102 are parallel to and spaced apart from each other. The third side 103 and the fourth side 104 are parallel to and spaced apart from each other. As shown in Fig. a, the third side 103 and the fourth side 104 are extended along a first direction D1, and the first side 101 and the second side 102 are extended along a second direction D2. The third side 103 has two opposite ends. One end of the third side 103 is connected to one end of the first side 101 and the other end of the third side 103 is connected to one end of the second side 102. The fourth side 104 has two opposite ends. One end of the fourth side 104 is connected to one end of the first side 101 away from the third side 103 and the other end of the fourth side 104 is connected to one end of the second side 102 away from the third side 103. The plurality of sub-mask plate 20 are used to selectively shield luminescent materials when preparing pixels, each sub-mask plate 20 is extended along the first direction D1 and the plurality of the sub-mask plates 20 are arranged along the second direction D2. Two opposite ends of the sub-mask plate 20 are respectively disposed on the first side 101 and the second side 102. The sub-mask plate 20 can do reciprocating motion along the first direction D1 or the second direction D2.

Referring to FIG. 2, FIG. 2 is a schematic diagram of a sub-mask plate in accordance with an embodiment of the present disclosure. The sub-mask plate 20 includes a bottom frame 201 and a sub-mask 202. The bottom frame 201 is a hollow structure, in the present embodiment, the bottom frame 201 is a strip-shaped hollow frame structure. The sub-mask 202 defines a plurality of openings 202a spaced apart from each other, which are used for the luminescent material to pass through when the pixels are prepared. Solid structure portions between the adjacent openings 202a are used for shielding the luminescent material when preparing the pixels. The sub-mask 202 is disposed on the bottom frame 201, and the bottom frame 201 provides no shield to the openings 202a in the sub-mask 202, that is, the bottom frame 201 cannot shield the openings 202a of the sub-mask 202. A first scale line 201a and a second scale line 201b are defined on the bottom frame 201. The first scale line 201a is set in accordance with the first side 101, and the second scale line 201b is set in accordance with the second side 102. Accordingly, a first standard scale line 101a is set on the first side 101, and a second standard scale line 102a is set on the second side 102. When the sub-mask plate 20 is mounted to the outer frame 10, the relative position relationship between the first scale line 201a and the first standard scale line 101a in the first direction D1 is adjusted, and the relative position relationship between the second scale line 201b and the second standard scale line 102a in the first direction D1 is adjusted, so as to adjust the position of the bottom frame 201 on the outer frame 10 accordingly.

The mask plate 1 further includes a first top wire 30 and a second top wire 40. Accordingly, a first through-hole 101b is defined in the first side 101 corresponding to the sub-mask plate 20 and passes through the first side 101, and one opening of the first through-hole 101b is adjacent to one end of the sub-mask plate 20. The first top wire 30 is set in the first through-hole 101b, and the first top wire 30 can move in the first through-hole 101b along the first direction D1. A second through-hole 102b is defined in the second side 102 corresponding to the sub-mask plate 20 and passes through the second side 102, and one opening of the second through-hole 102b is adjacent to the other end of the sub-mask plate 20. The second top wire 40 is set in the second through-hole 102b, and the second top wire 40 can move in the second through-hole 102b along the first direction D1 or the opposite direction of the first direction D1. The first top wire 30 and the second top wire 40 cooperate with each other so that the sub-mask plate 20 is moved along the first direction D1 or along the opposite direction of the first direction D1, so that the position adjustment of the sub-mask plate 20 along the first direction D1 is achieved, that is, the position of the sub-mask plate 20 can be adjusted along the first direction D1 accordingly.

For example, when it is necessary to move one sub-mask 20 by a certain distance d1 along the first direction D1, the first top wire 30 is moved by the distance d1 in the first through-hole 101b along the first direction D1, and the second top wire 40 is moved by the distance d1 in the second through-hole 102b along the first direction D1, so that the sub-mask plate 20 is moved by the distance d1 along the first direction D1, so as to adjust the position of the sub-mask plate 20 relative to the outer frame 10 in the first direction D1. Understandably, when the plurality of the sub-mask plates 20 need to be adjusted along the first direction D1, each of the sub-mask plates 20 can be adjusted respectively according to the above description.

Accordingly, when it is necessary to move one sub-mask 20 by a certain distance d2 along the opposite direction of the first direction D1, the second top wire 40 is moved by the distance d2 in the second through-hole 102b along the opposite direction of the first direction D1, and the first top wire 30 is moved by the distance d2 in the first through-hole 101b along the opposite direction of the first direction D1, thus the sub-mask plate 20 is moved by the distance d2 along the opposite direction of the first direction D1, so as to adjust the position of the sub-mask plate 20 relative to the outer frame 10 in the opposite direction of the first direction D1. Understandably, when the plurality of the sub-mask plates 20 need to be adjusted along the opposite direction of the first direction D1, each of the sub-mask plates 20 can be adjusted respectively according to the above description.

Typically, the number of the first through-hole 101b can be two, in detail, two first through-holes 101b are defined in the first side 101 corresponding to each sub-mask plate 20. Correspondingly, each of the first through-holes 101b corresponds to the first top wire 30. Two first through-holes 101b are respectively defined in two ends of one side of the sub-mask plate 20. The number of the second through-holes 102b can be two, in detail, two second through-holes 102b are defined in the second side 102 corresponding to each sub-mask plate 20. Correspondingly, each of the second through-holes 102b corresponds to the second top wire 40. Two second through-holes 102b are respectively defined in two ends of the other side of the sub-mask plate 20. Thus, two first through-holes 101b are defined in the first side 101 corresponding to each sub-mask plate 20, and each of the first through-holes 101b cooperates with the first top wire 30, at the same time, two second through-holes 102b are defined in the second side 102 corresponding to each sub-mask plate 20, and each of the second through-holes 102b cooperates with the second top wire 40. So that the sub-mask plate 20 is moved more uniformly along the first direction D1 and the opposite direction of the first direction D1 to prevent the sub-mask plate 20 from deviating when adjusting the position relationship of the sub-mask plate 20 relative to the outer frame 10 in the first direction D1.

According to the mask plate 1 of the present disclosure, the position of the sub-mask plate 20 relative to the outer frame 10 in the first direction D1 can be adjusted by the cooperation between the first top wire 30 and the first through-hole 101b as well as that between the second top wire 40 and the second through-hole 102b, further alleviating the technical issue of the poor color mixing caused by the position deviation of the sub-mask plate 20 relative to the outer frame 10 in the first direction D1 when the evaporating luminescent material is used for preparing the pixels, wherein the luminescent material may be, but not limited to, indium tin oxide.

The sub-mask plate 20 may be coarsely and finely adjusted along the second direction D2 or the opposite direction of the first direction D2 to adjust the position of the sub-mask plate relative to the outer frame in the second direction. When the sub-mask plate 20 is roughly adjusted along the second direction D2, the movement range of the sub-mask plate 20 is larger than that of the sub-mask plate 20 when being adjusted finely along the second direction D2, that is, the movement range of the sub-mask plate 20 when the sub-mask plate 20 is roughly adjusted along the second direction D2 is larger than the movement range of the sub-mask plate 20 when the sub-mask plate 20 is adjusted finely along the second direction D2; when the sub-mask plate 20 is roughly adjusted along the opposite direction of the second direction D2, the movement range of the sub-mask plate 20 is larger than that of the sub-mask plate 20 when being adjusted finely along the opposite direction of the second direction D2, that is, the movement range of the sub-mask plate 20 when the sub-mask plate 20 is roughly adjusted along the opposite direction of the second direction D2 is larger than the movement range of the sub-mask plate 20 when the sub-mask plate 20 is adjusted finely along the opposite direction of the second direction D2.

Specifically, in the present implementation, a first groove 101c is defined on the first side 101 corresponding to the sub-mask plate 20 and the first groove 101c is defined along the second direction D2. A second groove 102c is defined on the second side 102 corresponding to the sub-mask plate 20, and the second groove 102c is defined along the second direction D2. The mask plate 1 also includes a first locating pin 50 and a second locating pin 60 corresponding to the sub-mask plate 20. The first locating pin 50 is moved in the first groove 101c and the second locating pin 60 is moved in the second groove 102c, so that the sub-mask plate 20 can be moved in the second direction D2 or the opposite direction of the second direction D2, thus achieving rough adjustment of the sub-mask plate 20 relative to the outer frame 10 in the second direction D2.

The first locating pin 50 is provided with a first reference scale line, and the second locating pin 60 is provided with a second reference scale line. The first scale line 201a is set on the bottom frame 201 corresponding to the first side 101, and the second scale line 201b is set on the bottom frame 201 corresponding to the second side 201. The sub-mask plate 20 relative to the outer frame 10 in the second direction D2 may be finely adjusted by adjusting the relative position relationship between the first reference scale line and the first scale line as well as that between the second reference scale line and the second scale line.

A first position hole 101d is defined on the first side 101 corresponding to the sub-mask plate 20, and a second position hole 102d is defined on the second side 102 corresponding to the sub-mask plate 20. The sub-mask 202 adjacent to the first side 101 is provided with a first alignment hole 202b, and the sub-mask 202 adjacent to the second side 102 is provided with a second alignment hole 202c. FIG. 1 illustrates a case where the first position hole 101d coincides with the first alignment hole 202b, and the second position hole 102d coincides with the second alignment hole 202c. The first position hole 101d and the first alignment hole 202b serve as a reference when the outer frame 10 and the sub-mask plate 20 are fixed, and the second position hole 102d and the second alignment hole 202c serve as a reference when the outer frame 10 and the sub-mask plate 20 are fixed.

Compared with the related art, the mask plate 1 of the present disclosure can be roughly and finely adjusted in the second direction D2 so as to adjust the position of the sub-mask plate 20 relative to the outer frame 10 in the second direction D2, further alleviating the technical issue of the poor color mixing caused by the position deviation of the sub-mask plate 20 relative to the outer frame 10 in the second direction D2 when evaporating luminescent material is used for preparing the pixel.

By means of the previously described technical means, according to the mask plate 1 of the present disclosure, the position of the sub-mask plate 20 relative to the outer frame 10 in the first direction D1 can be adjusted and that in the second direction D2 can also be adjusted, further alleviating the technical issue of the poor color mixing caused by the position deviation of the sub-mask plate 20 relative to the outer frame in the first direction D1 and the second direction D2 when evaporating luminescent material is used for preparing the pixel.

In the present implementation, the opening 202a is rectangular. A long side of the opening 202 is parallel to the second direction D2, and a short side of the opening 202 is parallel to the first direction D1.

In one implementation, the first direction D1 is in an X direction, and the second direction D2 is in a Y direction. Or, in another embodiment, the first direction D1 is in the Y direction, and the second direction D2 is in the X direction.

Referring to FIG. 3, FIG. 3 is a schematic diagram of a section of two adjacent bottom frames in accordance with an embodiment of the present disclosure. The bottom frame 201 includes a shielding portion 201c, and the shielding portion 201c is configured to shield a partial gap between two adjacent bottom frames 201 when the two bottom frames 201 are mounted on the outer frame 10, so as to prevent the luminescent material from passing through a gap between two adjacent sub-mask plates 20 and then vapor-depositing to the product, thus eliminating poor products. In the present implementation, the shielding portion 201c is a rectangular strip having a length equal to a length of the bottom frame 201. A part of a long side of the shielding portion 201c is provided on the bottom frame and the remaining part is protruding. Typically, the protruding length of the long side of the shielding portion 201c is longer than a gap defined when the two adjacent sub-mask plates 20 are mounted on the outer frame 10, so as to shield the gap defined when the two adjacent sub-mask plates 20 are mounted on the outer frame 10. Typically, the shielding portion 201c and the bottom frame 201 are formed as a single piece.

While the present disclosure has been described in detail above with reference to the exemplary embodiments, the scope of the present disclosure is not limited thereto. As will occur to those skilled in the art, the present disclosure is susceptible to various modifications and changes without departing from the spirit and principle of the present disclosure. Therefore, the scope of the present disclosure should be determined by the scope of the claims.

What is claimed is:

1. A mask plate, comprising an outer frame and a plurality of sub-mask plates, wherein, the outer frame is a hollow structure and comprises a first side, a second side, a third side and a fourth side; the first side and the second side are parallel to and spaced apart from each other, the third side and the fourth side are parallel to and spaced apart from each other, the third side and the fourth side are extended along a first direction, and the first side and the second side are extended along a second direction; the third side has two opposite ends, with one end connected to one end of the first side and the other end connected to one end of the second side; the fourth side has two opposite ends, with one end connected to one end of the first side away from the third side and the other end connected to one end of the second side away from the third side; each sub-mask plate is configured to selectively shield luminescent material for preparing pixels and extends along the first direction, and the plurality of sub-mask plates are arranged along the second direction, the sub-mask plates has two opposite ends, with one end disposed on the first side and the other end disposed on the second side, and the sub-mask plate is capable of conducting reciprocating motion along the first direction or the second direction.

2. The mask plate of claim 1, wherein, the sub-mask plate comprises a bottom frame and a sub-mask, and the bottom frame is a hollow structure; a plurality of openings spaced apart from each other are defined in the sub-mask, the sub-mask is disposed on the bottom frame and the bottom frame provides no shield to the openings in the sub-mask;

the bottom frame is provided with a first scale line and a second scale line, the first scale line is set in correspondence with the first side, and the second scale line is set in correspondence with the second side; the first side is provided with a first standard scale line, and the second side is provided with a second standard scale line; a relative position relationship between the first scale line and the first standard scale line in the first direction is adjusted and a relative position relationship between the second scale line and the second standard scale line in the first direction is adjusted, so as to adjust the position of the bottom frame on the outer frame.

3. The mask plate of claim 2, wherein, the mask plate comprises a first top wire and a second top wire; at least one first through-hole is defined in the first side at locations corresponding to the sub-mask plate, one opening of the first through-hole is adjacent to one end of the sub-mask plate, the first top wire is set in the first through-hole, and the first top wire is configured to move in the first through-hole along the first direction; at least one second through-hole is defined in the second side at locations corresponding to the sub-mask plate, one opening of the second through-hole is adjacent to the other end of the sub-mask plate, the second top wire is set in the second through-hole, and the second top wire is configured to move along the first direction or along a direction opposite to the first direction in the second through-hole; the first top wire and the second top wire cooperate with each other so that the sub-mask plate is moved along the first direction or along the direction opposite to the first direction, so as to adjust the position of the sub-mask plate along the first direction.

4. The mask plate of claim 3, wherein, two first through-holes are defined in the first side at locations corresponding to each sub-mask plate, each first through-holes corresponds to the first top wire, and two first through-holes are respectively defined in two ends of one side of the sub-mask plate; two second through-holes are defined in the second side at locations corresponding to each sub-mask plate, each second through-hole corresponds to the second top wire, and two second through-holes are respectively defined in two ends of the other side of the sub-mask plate.

5. The mask plate of claim 4, wherein, the sub-mask plate is adjusted coarsely and finely in the second direction or the direction opposite to the second direction to adjust the position of the sub-mask plate relative to the outer frame in the second direction; and when the sub-mask plate is roughly adjusted along the second direction, the movement range of the sub-mask plate is larger than that of the sub-mask plate when being adjusted finely along the second direction; wherein when the sub-mask plate is roughly adjusted along the opposite direction of the second direction, the movement range of the sub-mask plate is larger than that of the sub-mask plate when being adjusted finely along the opposite direction of the second direction.

6. The mask plate of claim 5, wherein, a first groove is defined on the first side corresponding to the sub-mask plate, and the first groove is defined along the second direction; a second groove is defined on the second side corresponding to the sub-mask plate, and the second groove is defined along the second direction;

wherein, the mask plate further comprises a first locating pin and a second locating pin corresponding to the sub-mask plate, the first locating pin is moved in the first groove and the second locating pin is moved in the second groove, so that the sub-mask plate can be moved in the second direction or the opposite direction of the second direction, thus realizing rough adjustment of the sub-mask plate relative to the outer frame in the second direction.

7. The mask plate of claim 6, wherein the first locating pin is provided with a first reference scale line, and the second locating pin is provided with a second reference scale line; wherein the first scale line is set on the bottom frame corresponding to the first side, and the second scale line is set on the bottom frame corresponding to the second side; wherein the sub-mask plate relative to the outer frame in the second direction can be finely adjusted by adjusting the relative position relationship between the first reference scale line and the first scale line as well as that between the second reference scale line and the second scale line.

8. The mask plate of claim 6, wherein a first position hole is defined in the first side corresponding to the sub-mask plate, and a second position hole is defined in the second side corresponding to the sub-mask plate, wherein the sub-mask adjacent to the first side is provided with a first alignment hole, and the sub-mask adjacent to the second side is provided with a second alignment hole, wherein the first position hole and the first alignment hole serve as a reference when the outer frame and the sub-mask plate are fixed, and the second position hole and the second alignment hole serve as a reference when the outer frame and the sub-mask plate are fixed.

9. The mask plate of claim 1, wherein the first direction is in an X direction, and the second direction is in a Y direction; or the first direction is in the Y direction, and the second direction is in the X direction.

10. The mask plate of claim 2, wherein, the bottom frame comprises a shielding portion, and the shielding portion is configured to shield a partial gap between two adjacent bottom frames when the two adjacent bottom frames are mounted on the outer frame.

* * * * *